United States Patent
Falk et al.

(10) Patent No.: US 6,797,638 B2
(45) Date of Patent: Sep. 28, 2004

(54) PLASMA-ETCHING PROCESS FOR MOLYBDENUM SILICON NITRIDE LAYERS ON HALF-TONE PHASE MASKS BASED ON GAS MIXTURES CONTAINING MONOFLUOROMETHANE AND OXYGEN

(75) Inventors: Norbert Falk, Illschwang (DE); Günther Ruhl, Dorfen (DE)

(73) Assignees: Infineon Technologies AG, Munich (DE); Applied Materials GmbH, Ismaning (DE)

( * ) Notice: Subject to any disclaimer, the term of this patent is extended or adjusted under 35 U.S.C. 154(b) by 8 days.

(21) Appl. No.: 10/159,262

(22) Filed: May 31, 2002

(65) Prior Publication Data

US 2002/0192958 A1 Dec. 19, 2002

(30) Foreign Application Priority Data

May 31, 2001 (DE) .......................... 101 26 575

(51) Int. Cl.$^7$ ............................. H01L 21/302
(52) U.S. Cl. ................ 438/710; 438/711; 438/714; 438/720; 438/725; 438/754
(58) Field of Search ................ 438/710, 711, 438/714, 720, 725, 754

(56) References Cited

U.S. PATENT DOCUMENTS

| 6,027,837 A | * | 2/2000 | Adair et al. ............. 430/5 |
| 6,037,083 A | * | 3/2000 | Mitsui .................... 430/5 |
| 6,214,747 B1 | * | 4/2001 | Chou et al. ............ 438/780 |
| 6,599,666 B2 | * | 7/2003 | Rolfson ................... 430/5 |

OTHER PUBLICATIONS

C. Constantine et al.: "Inductively Coupled Plasma Etch of DUV MoSi Photomasks: A Designed Study of Etch Chemistries and Process Results", *Part of the BACUS Symposium on Photomask Technology and Management*, Redwood City, California, Sep. 1998, *SPIE*, vol. 3546, pp. 88–96.

* cited by examiner

*Primary Examiner*—Nadine G. Norton
*Assistant Examiner*—Binh X. Tran
(74) *Attorney, Agent, or Firm*—Laurence A. Greenberg; Werner H. Stemer; Ralph E. Locher

(57) ABSTRACT

A method for etching phase shift layers of half-tone phase masks includes etching a phase shift layer by using a plasma which is obtained from $CH_3F$ and $O_2$. A high cathode power is used for the etching. The method has a very high selectivity between the substrate and the phase shift layer, so that half-tone phase masks with a high imaging quality can be produced.

7 Claims, No Drawings

PLASMA-ETCHING PROCESS FOR MOLYBDENUM SILICON NITRIDE LAYERS ON HALF-TONE PHASE MASKS BASED ON GAS MIXTURES CONTAINING MONOFLUOROMETHANE AND OXYGEN

BACKGROUND OF THE INVENTION

Field of the Invention

The invention relates to a method for etching phase shift layers of half-tone phase masks.

The trend in microchips is toward an ever greater integration density of the electronic components. This increases the storage density of memory chips and also lowers the price of the individual component. The fabrication of microchips includes lithographic steps, in which a mask is used to reproduce the structure, which is to be produced on a substrate, in a photosensitive resist layer. After the resist layer has been developed, the result is a resist structure, which in turn can be used as a mask for etching processes or during the deposition of patterned semiconductor layers. A problem in this context is primarily the reproduction of the edges of the resist structure which is subsequently obtained. In this respect, it is necessary for the transition from the exposed region to the unexposed region to be as sharp as possible. As the minimum feature size of the components decreases, the relative size of the blurred region in the transition from the exposed region to the unexposed region increases in relation to the size of the component. In order to obtain a sharp contrast between exposed and unexposed regions in the photoresist even for very small structures, half-tone phase masks have been developed. A patterned layer of a phase shift material is deposited on a substrate which is transparent to the exposure wavelength. While the exposure radiation passes through the substrate without undergoing a phase shift in the regions which are not covered by the phase shift material, the exposure radiation undergoes a phase shift of 180° in the region which is covered by the phase shift material. The transmission of the exposure radiation is low in the region which is exposed with the phase shift material and is only approximately 3 to 10%. At the boundary between the uncovered regions and the regions which are covered with the phase shift material, the radiation in the reproduction or image formation on the photoresist has a phase difference of 180°. Therefore, in this region it is extinguished, resulting in a very sharply delineated transition in the photoresist between the exposed regions and the unexposed regions, and therefore also in a sharp edge form.

To fabricate half-tone phase masks, a layer of the phase shift material is patterned through the use of plasma etching using a mask. It is of crucial importance for the phase shift properties of the mask that, during etching of the phase shift layer, the substrate below it should not be etched or should only be etched to the minimum possible degree. This requires a high selectivity of the plasma-etching process, i.e. during the etching only the layer of the phase shift material should be etched, while the substrate provided below it should not be etched. Furthermore, as the minimum feature sizes become ever smaller, there should be no loss of dimensions. This means that there should be no undercut etching of the phase shift layer below the masking layer.

Hitherto, it has only been possible either to achieve a high etching selectivity or to avoid a loss of dimensions. C. Constantine, D. Johnson, R. J. Westerman, and A. Hourd (SPIE Proc., Vol. 3546, 1998, p. 88–97) have investigated the etching operation as a function of a change in various parameters for the conventional etching plasmas. The plasmas which are customary for industrial applications are produced from $CHF_3/O_2$, $CF_4/O_2$ and $SF_6$. A high selectivity of more than 3:1 can be achieved by the use of low-polymer etching chemicals, such as $SF_6$, with a low cathode power of the etching reactor. However, these etching processes predominantly take place isotropically and therefore result in a pronounced undercut etching of the mask and therefore in a considerable loss of dimensions. Undercut etching is avoided by the use of polymer-rich etching chemicals, such as for example $CHF_3/O_2$ or $CF_4/O_2$, at a higher cathode power. However, these processes have a poor etching selectivity with respect to an $SiO_2$ substrate, making the process difficult to control. In the event of excessive removal of material from the substrate by etching, the resulting phase angle of the substrate/phase shift material transition exceeds the required tolerances. As a result, the reproduction quality of the half-tone phase mask deteriorates, and it is no longer possible for the smallest possible structures to be reproduced without defects.

SUMMARY OF THE INVENTION

It is accordingly an object of the invention to provide a method for etching phase shift layers of half-tone phase masks which overcomes the above-mentioned disadvantages of the heretofore-known methods of this general type and which allows phase masks with a high reproduction quality to be fabricated.

With the foregoing and other objects in view there is provided, in accordance with the invention, a method for etching phase shift layers in half-tone phase masks, the method includes the steps of:

depositing a phase shift layer on a substrate;

applying a mask to the phase shift layer, the mask having a structure to be transferred into the phase shift layer; and etching the structure into the phase shift layer by carrying out a plasma etching in an etching reactor with a plasma produced from a fluorinated hydrocarbon having a ratio $F/H \leq 2$ and $O_2$.

According to another mode of the invention, $CH_3F$ is used as the fluorinated hydrocarbon.

According to yet another mode of the invention, the cathode power for the etching reactor is selected to be greater than 20W.

According to a further mode of the invention, the molar ratio of the fluorinated hydrocarbon to the $O_2$ is selected to be between 2:1 and 1:2 for producing the plasma.

According to another mode of the invention, an inert gas is added to the plasma for etching the structure into the phase shift layer.

According to yet another mode of the invention, the phase shifter layer is composed of a molybdenum/silicon nitride (MoSiN).

According to another mode of the invention, the substrate is composed of quartz glass.

According to a further mode of the invention, the mask is configured as a chrome mask.

According to an additional mode of the invention, a re-etching step is carried out subsequent to etching the structure into the phase shift layer.

According to another mode of the invention, a plasma produced from $SF_6$ is used for carrying out the re-etching step.

Other features which are considered as characteristic for the invention are set forth in the appended claims.

Although the invention is described herein as embodied in a method for etching phase shift layers of half-tone phase masks it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

According to the invention, a method for etching phase shift layers of half-tone phase masks includes depositing a phase shift layer on a substrate and applying a mask to the phase shift layer. The mask has a structure which is to be transferred into the phase shift layer, and the structure is etched into the phase shift layer by plasma etching. The plasma etching is carried out in an etching reactor using a plasma which is produced from a fluorinated hydrocarbon with an F/H ratio$\leq 2$ and $O_2$.

It has been found that, with the method according to the invention, it is possible to achieve a very high selectivity between the phase shift material and the material of the substrate. Furthermore, during the etching operation the side walls of the trenches which have been etched into the phase shift layer are passivated, so that there is no undercut etching of the mask and therefore a loss of dimensions is avoided. On account of polymer formation, unlike $SF_6$ plasmas the plasmas which are used for the etching do not react spontaneously with the phase shift material. The etching attack only commences when a certain cathode power, i.e. a certain minimum ion energy, is applied. As a result, the anisotropic etching characteristic is brought about with passivation of the structure side walls. At the same time, when the boundary layer with respect to the substrate is reached, a thin, passivating stop layer is produced. This layer has a very high selectivity (>25:1) with respect to the phase shift material and leads to etching being stopped.

All conventional materials can be used as the substrate, provided that they are transparent to the exposure radiation which is used for the subsequent exposure of the photoresist layer. On account of its high transparency to light with a very short wavelength of less than 400 nm, quartz glass is a particularly preferred substrate. It is also possible for the conventional materials to be used for the phase shift layer. It is particularly preferable for the phase shift layer to be composed of a molybdenum-silicon nitride. The ratio of molybdenum to silicon can be varied within wide ranges. It is customary for the molybdenum to be present in amounts ranging from 5 to 15 atomic %, based on the total nitride. The molybdenum/silicon nitride may also include further elements, for example oxygen.

The mask for etching the structure into the phase shift material likewise is formed of conventional materials and is patterned using standard processes. The mask is preferably configured as a chrome mask. For the patterning, a layer of a photoresist is applied to the chrome mask and is then exposed and patterned using standard processes. The patterning of the chrome layer then takes place, for example, by etching in a $Cl_2/O_2$ plasma.

Usually, an approximately 90 to 95 nm thick layer of MoSiN as phase shift material is applied to a substrate of quartz glass. An approx. 100 nm thick chromium layer is located on top of the phase shift material, and then an approx. 300 nm to 500 nm thick photoresist layer is applied to the chromium layer.

As has already been mentioned, the mask is patterned by etching using a plasma which is produced from a fluorinated hydrocarbon with an F/H ratio of $\leq 2$ and $O_2$. It is preferable for the fluorinated hydrocarbon to include no more than four carbon atoms. Examples of suitable fluorinated hydrocarbons are $C_2H_5F$, $C_2H_4F_2$ and $CH_3F$. $CH_3F$ is particularly preferred.

To produce the plasma, the molar ratio of the fluorinated hydrocarbon to the $O_2$ is preferably selected to be between 2:1 and 1:2. To improve the selectivity, the shape of the edge or flank and the uniformity of etching, further gases may be added to the plasma. These further gases are primarily inert gases, such as for example noble gases, such as He or Ar.

The selectivity and anisotropy of the method according to the invention are based on a polymer being formed on the substrate or on the side flanks or side walls of the etched-in trenches. The etching attack only commences at a certain minimum ion energy. Therefore, the cathode power of the etching reactor for etching the structure into the phase shift layer is suitably selected to be greater than 20W. The etching reactor used is preferably an ICP (Inductively Coupled Plasma) etching reactor.

The stop layer which is formed on the uncovered substrate when the structure is etched into the phase shift layer can be removed in a re-etching step after the first etching step has ended. If a substrate of quartz glass is used, the re-etching step is preferably carried out using a plasma which is produced from $SF_6$. The re-etching step is carried out at a low cathode power, and it is possible to achieve a selectivity with respect to the $SiO_2$ of 20:1.

In an ICP etching reactor, the method according to the invention is preferably carried out using the following parameters:

a) etching of the structure into the phase shift layer
   $CH_3F:O_2$ ratio=2:1–1:2;
   reactive gas ($CH_3F/O_2$):inert gas (e.g. He) ratio= 1:0–^:^0;
   cathode power (bias power)=20–400 W;
   ICP power (source power)=0–1000 W;
   pressure=0.13–2.67 Pa (1–20 mTorr).

b) re-etching step:
   $SF_6$:inert gas (e.g. He) ratio=1:0–1:10;
   cathode power (bias power)=0–100 W;

ICP power (source power)=0–1000 W;
pressure=0.13–13.3 Pa (1–100 mTorr).

We claim:

1. A method for etching phase shift layers in half-tone phase masks, the method which comprises:

depositing a molybdenum silicon nitride phase shift layer on a substrate;

applying a chrome mask to the phase shift layer, the mask having a structure to be transferred into the phase shift layer; and etching the structure into the phase shift layer by carrying out a plasma etching in an etching reactor with a plasma produced from a fluorinated hydrocarbon having a ratio F/H±2 and from $O_2$, a molar ratio of the fluorinated hydrocarbon to the $O_2$ being between 2:1 and 1:2.

2. The method according to claim 1, which comprises using $CH_3F$ as the fluorinated hydrocarbon.

3. The method according to claim 1, which comprises selecting a cathode power of the etching reactor to be greater than 20W for etching the structure into the phase shift layer.

4. The method according to claim 1, which comprises adding an inert gas to the plasma for etching the structure into the phase shift layer.

5. The method according to claim 1, which comprises providing a quartz glass as the substrate.

6. The method according to claim 1, which comprises carrying out a re-etching step subsequent to etching the structure into the phase shift layer.

7. The method according to claim 6, which comprises using a plasma produced from $SF_6$ for carrying out the re-etching step.

* * * * *